United States Patent
Krishnamurthy

(10) Patent No.: US 10,308,480 B2
(45) Date of Patent: Jun. 4, 2019

(54) EMBEDDED POWER MODULE

(71) Applicant: OTIS ELEVATOR COMPANY, Farmington, CT (US)

(72) Inventor: Shashank Krishnamurthy, Glastonbury, CT (US)

(73) Assignee: OTIS ELEVATOR COMPANY, Farmington, CT (US)

(*) Notice: Subject to any disclaimer, the term of this patent is extended or adjusted under 35 U.S.C. 154(b) by 230 days.

(21) Appl. No.: 15/205,936

(22) Filed: Jul. 8, 2016

(65) Prior Publication Data

US 2018/0009637 A1 Jan. 11, 2018

(51) Int. Cl.
*H01L 23/538* (2006.01)
*B66B 11/04* (2006.01)
(Continued)

(52) U.S. Cl.
CPC ...... *B66B 11/0407* (2013.01); *H01L 23/5384* (2013.01); *H01L 23/5386* (2013.01); *H01L 23/5389* (2013.01); *H01L 24/20* (2013.01); *H01L 25/072* (2013.01); *H05K 1/0306* (2013.01); *H05K 1/112* (2013.01); *H05K 1/181* (2013.01); *H05K 1/185* (2013.01); *B66B 9/003* (2013.01); *H01L 2224/04105* (2013.01); *H01L 2224/24137* (2013.01); *H01L 2224/2518* (2013.01); *H01L 2924/10253* (2013.01);
(Continued)

(58) Field of Classification Search
None
See application file for complete search history.

(56) References Cited

U.S. PATENT DOCUMENTS 9,156,659 B2 10/2015 Dias
2008/0236955 A1 10/2008 Kattainen et al.
(Continued)

FOREIGN PATENT DOCUMENTS

CN 201240724 Y 5/2009
CN 203998482 U 12/2014
(Continued)

OTHER PUBLICATIONS

Appunn, "Contactless power supply for magnetically levitated elevator systems"; Institute of Electrical Machines (IEM), RWTH Aachen University, Schinkelstr. 4, D-520; 2012; Internet; URL: http://134.130.107.200/uploads/bibliotest/2012RAContactless.pdf.
(Continued)

*Primary Examiner* — Michelle Mandala
*Assistant Examiner* — Jordan M Klein
(74) *Attorney, Agent, or Firm* — Cantor Colburn LLP

(57) ABSTRACT

An embedded power module includes a substrate, first and second semiconducting dies, first and second gates, and first and second vias. The first semiconducting die is embedded in the substrate and spaced between opposite first and second surfaces of the substrate. The second semiconducting die is embedded in the substrate, is spaced between the first and second surfaces, and is spaced from the first semiconducting die. The first gate is located on the first surface. The second gate is located on the second surface. The first via is electrically engaged to the first gate and the second semiconducting die, and the second via is electrically engaged to the second gate and the first semiconducting die.

3 Claims, 4 Drawing Sheets

(51) Int. Cl.
  *H01L 25/07* (2006.01)
  *H05K 1/03* (2006.01)
  *H05K 1/11* (2006.01)
  *H05K 1/18* (2006.01)
  *H01L 23/00* (2006.01)
  *B66B 9/00* (2006.01)

(52) U.S. Cl.
  CPC .............. *H01L 2924/13055* (2013.01); *H01L 2924/13091* (2013.01); *H01L 2924/3025* (2013.01); *H05K 2201/10015* (2013.01); *H05K 2201/10166* (2013.01)

(56) References Cited

U.S. PATENT DOCUMENTS

| | | |
|---|---|---|
| 2010/0127407 A1 | 5/2010 | Leblanc et al. |
| 2011/0127675 A1* | 6/2011 | Ewe .................. H01L 23/5389 257/773 |
| 2013/0058067 A1 | 3/2013 | Yee et al. |
| 2013/0341776 A1* | 12/2013 | Drobnik ............ H01L 23/5385 257/675 |
| 2015/0028448 A1 | 1/2015 | Hosseini et al. |
| 2015/0145111 A1* | 5/2015 | Mengel ............... H01L 25/165 257/675 |
| 2016/0079156 A1* | 3/2016 | Liu ................... H01L 23/5389 257/675 |
| 2016/0118337 A1* | 4/2016 | Yoon .................. H01L 24/19 257/753 |

FOREIGN PATENT DOCUMENTS

| | | |
|---|---|---|
| CN | 204689286 U | 10/2015 |
| EP | 2988328 A1 | 2/2016 |
| WO | 2011137845 A1 | 11/2011 |
| WO | 2012012338 A1 | 1/2012 |
| WO | 2014182272 A1 | 11/2014 |
| WO | WO-2014182272 A1 * | 11/2014 ......... B66B 11/0407 |

OTHER PUBLICATIONS

Escalator Integrated Drive and Controller; STEP; Internet; URL: http://liftcontrolsystem.com/1-5-escalator-integrated-drive.html; 7 pgs.
Yamakawa, "Mitsubishi Electric RD Advance"; Power Electronics Edition; 2000; vol. 89; Internet; URL: http://www.mitsubishielectric.com/company/rd/advance/pdf/vol89/vol89.pdf; 32 pgs.
European Search Report for application No. 17180321.6-1555 dated Dec. 12, 2017; 7 pages.

* cited by examiner

EMBEDDED POWER MODULE

BACKGROUND

The present disclosure relates to an embedded power module, and more particularly to an embedded power module of a transport system.

Typical power module designs, such as those used in transport systems (e.g., elevators, escalators, and others), include silicon insulated gate bipolar transistors (IGBT) and diodes. The semiconductor devices may be attached to a ceramic substrate and wire bonded to form the necessary electrical connections. The assembly may then be placed in a plastic housing that is connected to the user design application through screw terminals or press fit pins.

SUMMARY

An embedded power module according to one, non-limiting, embodiment of the present disclosure includes a substrate including opposite first and second surfaces; a first semiconducting die embedded in the substrate and spaced between the first and second surfaces; a second semiconducting die embedded in the substrate, spaced between the first and second surfaces, and spaced from the first semiconducting die; a first gate located on the first surface; a second gate located on the second surface; a first via electrically engaged to the first gate and the second semiconducting die; and a second via electrically engaged to the second gate and the first semiconducting die.

Additionally to the foregoing embodiment, a first conductor pad located on the second surface and spaced from the second gate; at least one third via electrically engaged to the first semiconducting die and the first conductor pad; and at least on fourth via electrically engaged to the second semiconducting die and the first conductor pad.

In the alternative or additionally thereto, in the foregoing embodiment, the embedded power module includes a second conductor pad located on the first surface; a third conductor pad located on the first surface and spaced from the first conductor pad; at least one fifth via electrically engaged to the first semiconducting die and the second conductor pad; and at least one sixth via electrically engaged to the second semiconducting die and the third conductor pad.

In the alternative or additionally thereto, in the foregoing embodiment, the first conductor pad is a phase conductor pad, the second conductor pad is a direct current (DC) plus pad, and the third conductor pad is a DC minus pad.

In the alternative or additionally thereto, in the foregoing embodiment, the embedded power module includes a capacitor electrically connected between the second and third conductor pads.

In the alternative or additionally thereto, in the foregoing embodiment, the first and second semiconducting dies are semiconductor devices.

In the alternative or additionally thereto, in the foregoing embodiment, the first, second and third conductor pads are collector/emitter pads.

In the alternative or additionally thereto, in the foregoing embodiment, at least one of the first second and third conductor pads are configured to provide at least one of electrical shielding and substrate cooling.

In the alternative or additionally thereto, in the foregoing embodiment, at least one of the first, second and third conductor pads are copper traces.

In the alternative or additionally thereto, in the foregoing embodiment, the embedded power module includes at least one isolated trace located on at least one of the first and second surfaces for shielding.

In the alternative or additionally thereto, in the foregoing embodiment, the first, second, third, fourth, fifth, and sixth vias are printed circuit board (PCB) vias.

In the alternative or additionally thereto, in the foregoing embodiment, the at least one third via is two vias, the at least one fourth via is three vias, the at least one fifth via is three vias, and the at least one sixth via is two vias.

In the alternative or additionally thereto, in the foregoing embodiment, the substrate is non-conductive.

In the alternative or additionally thereto, in the foregoing embodiment, the substrate is a ceramic.

In the alternative or additionally thereto, in the foregoing embodiment, the motor second and third conductor pads connect to respective alternating current (AC) pads.

In the alternative or additionally thereto, in the foregoing embodiment, the embedded power module is selected from the group consisting of a battery charger, a transport system, a propulsion system, a compressor drive, a pump drive, and a fan drive.

A transport system in a structure and in accordance with another, non-limiting, embodiment includes a car constructed and arranged to move along a lane generally defined at least in-part by the structure; and a plurality of motor modules distributed along the lane and constructed and arranged to propel the car, each one of the plurality of motor modules including an embedded power module.

Additionally to the foregoing embodiment, the embedded power module includes a substrate having opposite first and second surfaces; a first semiconductor device embedded in the substrate and spaced between the first and second surfaces; a second semiconductor device embedded in the substrate, spaced between the first and second surfaces, and spaced from the first semiconductor device; a first gate located on the first surface; a second gate located on the second surface; a first via electrically engaged to the first gate and the second semiconductor device; and a second via electrically engaged to the second gate and the first semiconductor device.

In the alternative or additionally thereto, in the foregoing embodiment, the embedded power module includes a first collector/emitter pad located on the second surface and spaced from the second gate; at least one third via electrically engaged to the first semiconductor device and the first collector/emitter pad; and at least on fourth via electrically engaged to the second semiconductor device and the first collector/emitter pad.

In the alternative or additionally thereto, in the foregoing embodiment, the embedded power module includes a second collector/emitter pad located on the first surface; a third collector/emitter pad located on the first surface and spaced from the first collector/emitter pad; at least one fifth via electrically engaged to the first semiconductor device and the second collector/emitter pad; and at least one sixth via electrically engaged to the second semiconductor device and the third collector/emitter pad The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
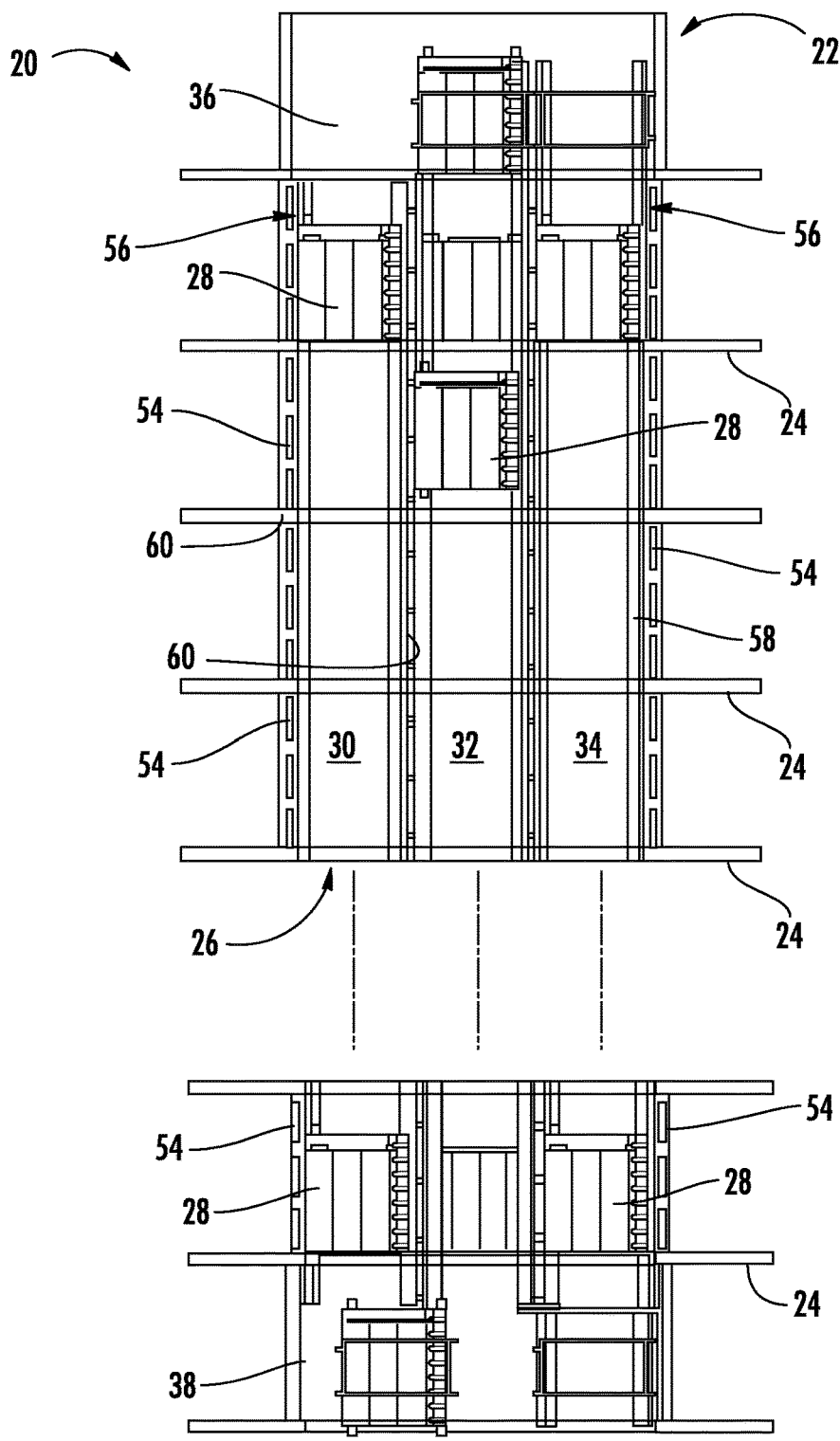
FIG. 1 depicts a transport system as one non-limiting embodiment utilizing an exemplary embodiment of an embedded power module of the present disclosure.

FIG. 1 depicts a self-propelled or ropeless elevator system as one, non-limiting, example of a transport system 20. The transport system 20 is one, non-limiting, example of an application of an embedded power module 21 in an embodiment of the present disclosure. The ropeless elevator system 20 may be used in a structure or building 22 having multiple levels or floors 24. Elevator system 20 includes a hoistway 26 defined by boundaries carried by the structure 22, and at least one car 28 adapted to travel in the hoistway 26. The hoistway 26 may include, for example, three lanes 30, 32, 34 with any number of cars 28 traveling in any one lane and in any number of travel directions (e.g., up and down). For example and as illustrated, the cars 28 in lanes 30, 34, may travel in an up direction and the cars 28 in lane 32 may travel in a down direction. It is further contemplated and understood that other transport systems 20 may include escalators, mono-rails, and other systems traveling in any number of directions.

Pertaining to the example of an elevator system 20 in the building 22, above the top floor 24 may be an upper transfer station 36 that facilitates horizontal motion to elevator cars 28 for moving the cars between lanes 30, 32, 34. Below the first floor 24 may be a lower transfer station 38 that facilitates horizontal motion to elevator cars 28 for moving the cars between lanes 30, 32, 34. It is understood that the upper and lower transfer stations 36, 38 may be respectively located at the top and first floors 24 rather than above and below the top and first floors, or may be located at any intermediate floor. Yet further, the elevator system 20 may include one or more intermediate transfer stations (not illustrated) located vertically between and similar to the upper and lower transfer stations 36, 38.

Figure 2:
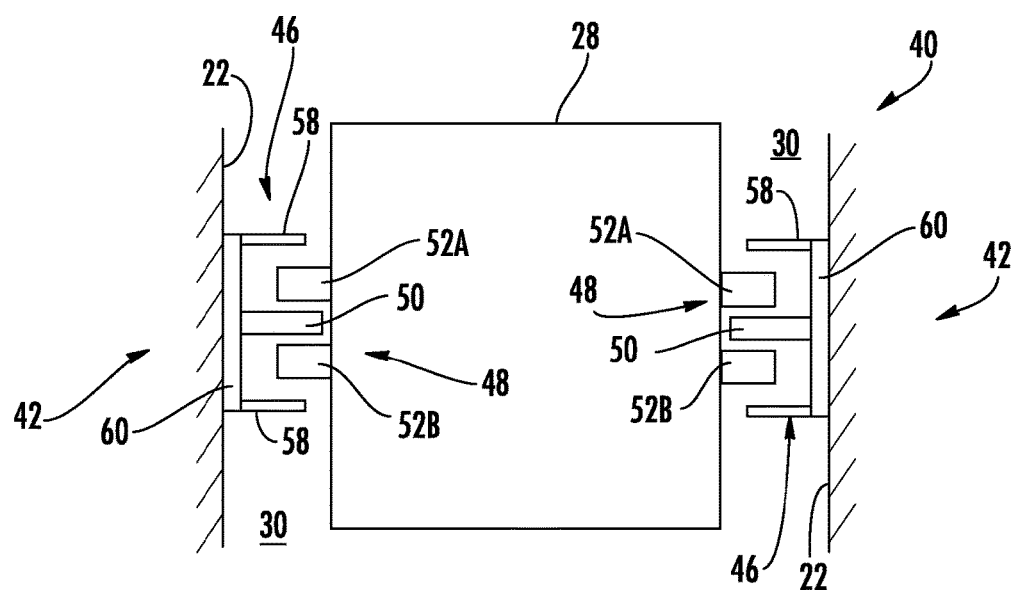
FIG. 2 is a top down view of a car and portions of a propulsion system of the transport system.

Referring to FIGS. 1 and 2, the cars 28 are propelled using a propulsion system 40 such as a linear propulsion system. The propulsion system 40 may include two linear, magnetic, propulsion motors 42 that may be generally positioned on opposite sides of the elevator cars 28, and a control system 44 (see FIG. 3). Each motor 42 may include a fixed primary portion 46 generally mounted to the building 22, and a moving secondary portion 48 mounted to the elevator car 28. More specifically, the primary portions 46 may be located within the lanes 30, 32, 34 on walls or sides of the building 22 generally not associated with an elevator door.

Each primary portion 46 includes a plurality of windings or coils 50 (i.e. phase windings) that generally form a row extending longitudinally along and projecting laterally into each of the lanes 30, 32, 34. Each secondary portion 48 may include two rows of opposing permanent magnets 52A, 52B mounted to each car 28. The plurality of coils 50 of the primary portion 46 are generally located between and spaced from the opposing rows of permanent magnets 52A, 52B. It is contemplated and understood that any number of secondary portions 48 may be mounted to the car 28, and any number of primary portions 46 may be associated with the secondary portions 48 in any number of configurations. It is further understood that each lane may be associated with only one linear propulsion motor 42, or three or more motors 42. Yet further, the primary and secondary portions 46, 48 may be interchanged.

The secondary portion 48 operatively engages with the primary portion 46 to support and drive the elevators cars 28 within the lanes 30, 32, 34. Primary portion 46 is supplied with drive signals from one or more drives 54 of the control system 44 to control movement of elevator cars 28 in their respective lanes through the linear, permanent magnet motor system 40. The secondary portion 48 operatively connects with and electromagnetically operates with the primary portion 46 to be driven by the signals and electrical power. The driven secondary portion 48 enables the elevator cars 28 to move along the primary portion 46 and thus move within a lane 30, 32, 34.

The primary portion 46 may be formed from a plurality of motor segments or modules 56, with each module associated with a drive 54 of the control system 44. Although not shown, the central lane 30 (see FIG. 1) also includes a drive for each module 56 of the primary portion 46 that is within the lane 30. Those with ordinary skill in the art will appreciate that although a drive 54 is provided for each motor module 56 of the primary portion 46 (one-to-one) other configurations may be used without departing from the scope of this disclosure.

Figure 3:
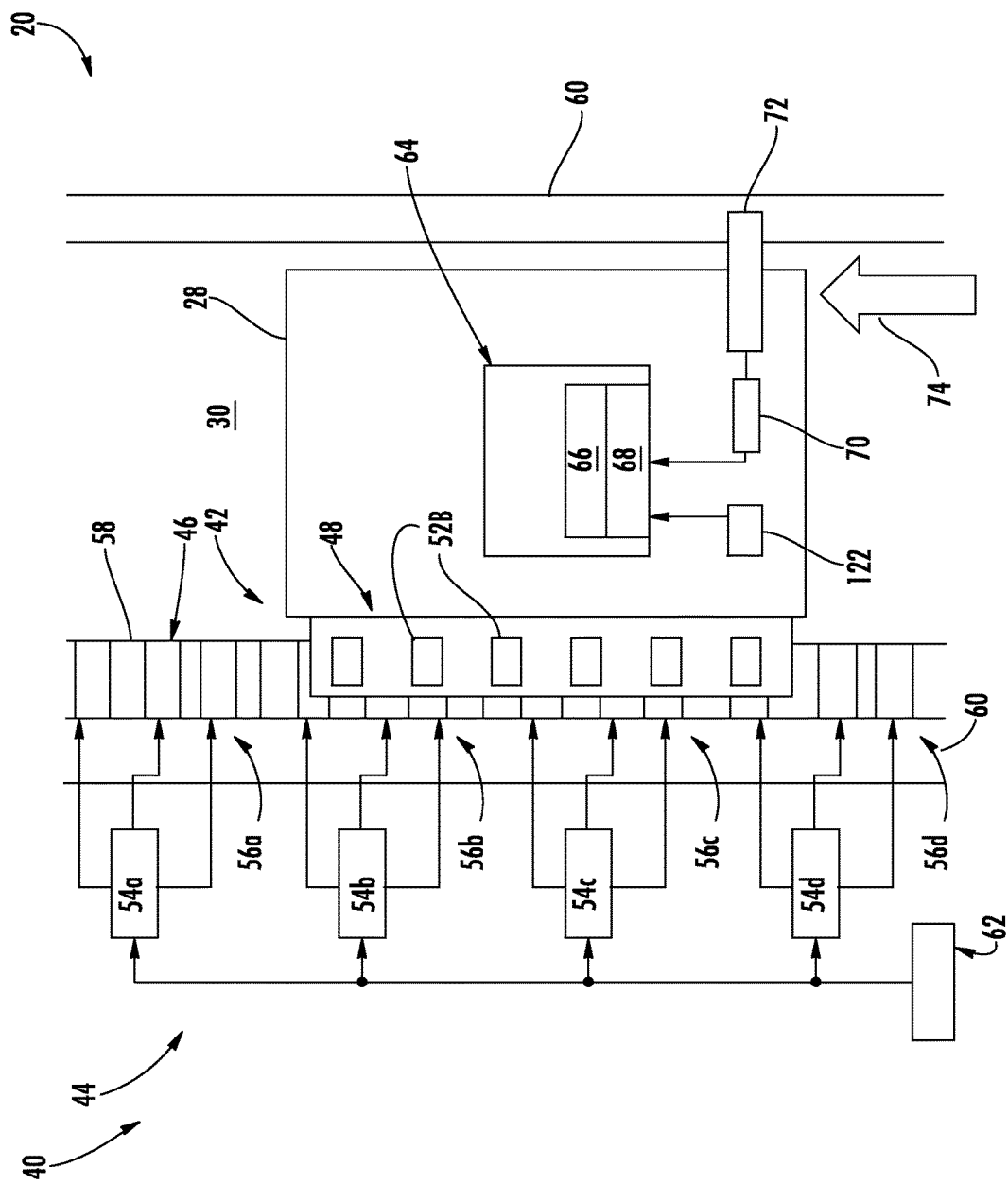
FIG. 3 is a schematic of the propulsion system.

Referring to FIGS. 2 and 3, a view of the elevator system 20 including the elevator car 28 that travels in lane 30 is shown. The elevator car 28 is guided by one or more guide rails 58 extending along the length of lane 30, where the guide rails 58 may be affixed to a structural member 60 that may also support the coils 52A, 52B of the primary portion 46. The primary portion 46 may be mounted to the guide rail 58, incorporated into the guide rail 58, or may be located apart from guide rail 54 on structural member 60 (as shown). The primary portion 46 serves as a stator of a permanent magnet synchronous linear motor to impart force to elevator car 28. Coils 50 of motor modules 56 (four illustrated and identified as 56a, 56b, 56c, and 56d) may be arranged in three phases, as is known in the electric motor art. One or more primary portions 46 may be mounted in the lane 30, to co-act with permanent magnets 52A, 52B mounted to the elevator car 28.

Each of the motor modules 56a, 56b, 56c, 56d may have a corresponding or associated drive 54a, 54b, 54c, 54d of the control system 40. A system controller 62 provides drive signals to the motor modules 56a, 56b, 56c, 56d via respective drives 54a, 54b, 54c, 54d to control motion of the elevator car 28. The system controller 62 may be implemented using a microprocessor executing a computer program stored on a storage medium to perform the operations described herein. Alternatively, the system controller 62 may be implemented in hardware (e.g., application specific integrated circuit, and field programmable gate array) or in a combination of hardware/software. The system controller 62 may include power circuitry (e.g., an inverter or drive) to power the primary portion 46 of the linear motor 42. Although a single system controller 62 is depicted, it will be understood by those of ordinary skill in the art that a plurality of system controllers may be used. For example, a single system controller may be provided to control the operation of a group of motor modules over a relatively short distance, and in some embodiments a single system controller may be provided for each drive or group of drives, with the system controllers in communication with each other.

In order to drive the elevator car 28, one or more motor modules 56*a*, 56*b*, 56*c*, 56*d* may be configured to overlap the secondary portion 48 secured to the elevator car 28 at any given point in time. For example and as illustrated in FIG. 3, motor module 56*d* partially overlaps the secondary portion 48 (e.g., about 33% overlap of the module), motor module 56*c* fully overlaps the secondary portion 48 (100% overlap of the module), and motor module 56*d* partially overlaps the secondary portion 48 (e.g., about 66% overlap of the module). There is no depicted overlap between motor module 56*a* and the secondary portion 48. In some embodiments, the control system 44 (i.e., system controller 62 and on-board controller 64) is operable to apply an electrical current to at least one of the motor modules 56*b*, 56*c*, 56*d* that overlaps the secondary portion 48. The system controller 62 may control the electrical current on one or more of the drives 54*a*, 54*b*, 54*c*, 54*d* while receiving data from an on-board controller 64 via a transceiver 66 based on a load sensor 70 in the car 28. The electrical current may induce an upward thrust force (see arrow 74) to the elevator car 28 by injecting a constant current, thus propelling the elevator car 28 within the lane 30. The thrust produced by the propulsion system 40 is dependent, in part, on the amount of overlap between the primary portion 46 with the secondary portion 48. The peak thrust is obtained when there is maximum overlap of the primary portion 46 and the secondary portion 48.

Figure 4:
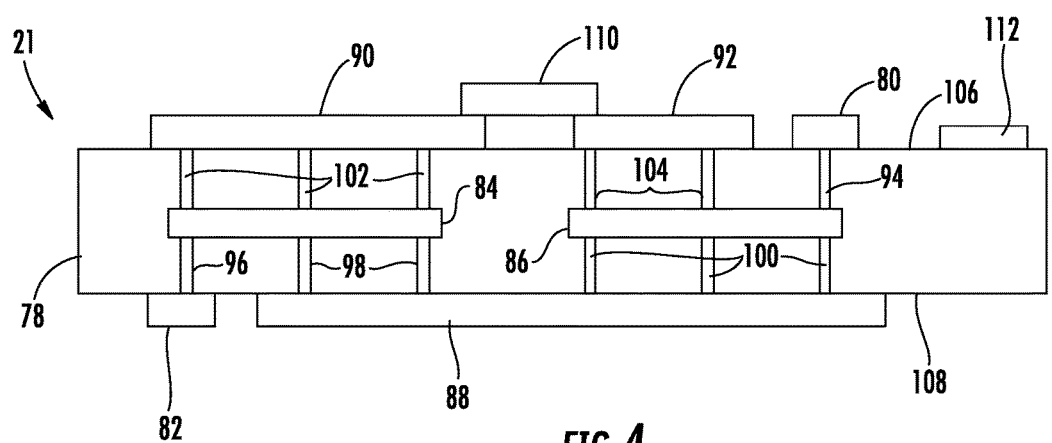
FIG. 4 is a cross section of the embedded power module of the transport system.
Figure 5:
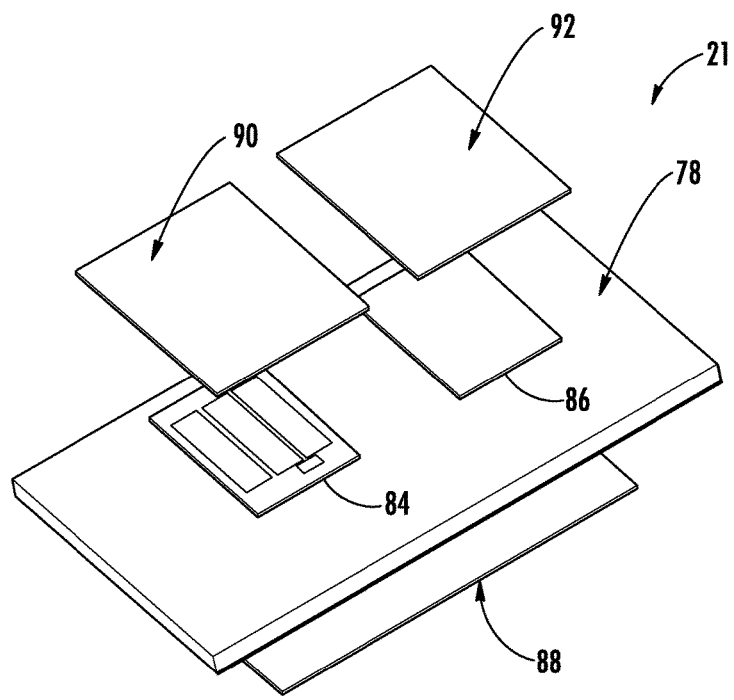
FIG. 5 is an exploded perspective view of the embedded power module.

Referring to FIGS. 4 and 5, each drive 54 may include at least one embedded power module 21 that may be into the motor module 56, and is configured to provide power from a source to the motor module 56. The embedded power module 21 may include: a substrate 78; first and second gates 80, 82; first and second semiconducting dies 84, 86; first, second, and third conductor pads 88, 90, 92; and first, second, third, fourth, fifth and sixth vias 94, 96, 98, 100, 102, 104. The substrate 78 may include a first surface 106 and a second surface 108 that may face substantially in an opposite direction from the first surface. The substrate 78 may be made of an electrically non-conductive material such as, for example, ceramic. It is contemplated and understood that the embedded power module 21 in alternative embodiments may be incorporated into the other motor structures associated with the motor module 56.

The first and second gates 80, 82 facilitate the switching 'on' or 'off' of the semiconductor dies 84, 86, with the first gate 80 mounted or adhered to the first surface 106 of the substrate 78 and the second gate 82 mounted or adhered to the second surface 108. The first and second semiconducting dies 84, 86 may be semiconductor devices. More specifically, the first and second dies 84, 86 may be silicon insulated gate bipolar transistors (IGBT), or metal-oxide semiconductor field-effect transistors (MOSFET), configured to facilitate the output current and is connected to the load. Both the first and second semiconducting dies 84, 86 are generally embedded (i.e., suspended) within the substrate 78, are spaced from one-another, and are spaced from the opposite surfaces 106, 108. It is further contemplated and understood that either die 84, 86 may be a diode; however, is such an example there would be no gate connection present.

The first, second, and third conductor pads 88, 90, 92 may be collector/emitter pads for the example of IGBTs, and may be drain/source pads for the example of MOSFETs. The first conductor pad 88 may be a phase pad that facilitates the output current and is connected to the load, and is mounted or adhered to the second surface 108 of the substrate 78. The second conductor pad 90 may be a direct current (DC) plus pad, and is mounted or adhered to the first surface 106 of the substrate 78. Both conductor pads 88, 90 facilitate connection to a DC link of the power module 21. The third conductor pad 92 may be a DC minus pad, and is mounted or adhered to the first surface 106 and spaced from the second conductor pad 90. The conductor pads 88, 90, 92 may be copper traces and/or may be sized to also function as electrical shielding and/or thermal cooling pads to dissipate heat. It is contemplated and understood that the second and third conductor pads 90, 92 may be configured to connect to respective alternating current (AC) pads of any variety of drive units, motors, and the like.

The vias 94, 96, 98, 100, 102, 104 may generally be printed circuit board (PCB) vias, and facilitate the electrical connections between components and at least partially through the substrate 78. The first via 94 may electrically connect the first gate 80 to the second semiconducting die 86. The second via 96 may electrically connect the second gate 82 to the first semiconducting die 84. The third via(s) 98 (i.e., two illustrated) may each electrically connect the first conductor pad 88 to the first semiconducting die 84. The fourth via(s) 100 (i.e., three illustrated) may each electrically connect the first conductor pad 88 to the second semiconducting die 86. The fifth via(s) 102 (i.e., three illustrated) may each electrically connect the second conductor pad 90 to the first semiconducting die 84. And, the sixth via(s) 104 (i.e., two illustrated) may each electrically connect the third conductor pad 92 to the second semiconducting die 86.

The embedded power module 21 may further include a capacitor 110 that functions as a DC storage element. The capacitor 110 may provide the energy required during switching of the dies 84, 86, and also the energy required by the power module 56 during load transients. The capacitor 110 may be electrically connected to the second and third conductor pads 90, 92, and may not be embedded in the substrate 78. In addition to the conductor pads 88, 90, 92, the embedded power module 21 may include one or more electrically isolated pads 112 (i.e., not connected to a via) secured to one or both of the surfaces 106, 108 of the substrate 78 for electrical shielding purposes.

It is further contemplated and understood that the embedded power module 21 may be used in any variety of power electronic converters. The embedded power module 21 may further be a drive used for any variety of transport systems, for example, as used in the propulsion systems of cars, trains, and the like, and is not limited to elevators. Further, the embedded power module 21 may be used in drives configured to drive a compressor, pump, fan, and the like. Still further, non-limiting examples of the embedded power module 21 includes power supplies, battery chargers, power conditioning systems, and the like.

Advantages and benefits of the present disclosure include an embedded power module that may integrate power and control stages of electrical circuits in one step, and a module with novel orientations of the devices in the phase leg to minimize loop inductance toward improvement in switching speed and reduced loss. Moreover, the present orientation enables closer spacing of gate drive circuits to the devices for improved switching, and the use of metallic pads that enhance cooling. Other advantages may include improved reliability by minimizing or eliminating solder and/or wire bonds, reduced manufacturing costs, and improved packaging and robustness.

While the present disclosure is described with reference to exemplary embodiments, it will be understood by those skilled in the art that various changes may be made and equivalents may be substituted without departing from the spirit and scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. An embedded power module comprising:
   a substrate including opposite first and second surfaces;
   a first semiconducting die embedded in the substrate and spaced between the first and second surfaces;
   a second semiconducting die embedded in the substrate, spaced between the first and second surfaces, and spaced from the first semiconducting die;
   a first gate located on the first surface;
   a second gate located on the second surface;
   a first via electrically engaged to the first gate and the second semiconducting die;
   a second via electrically engaged to the second gate and the first semiconducting die;
   a first conductor pad located on the second surface and spaced from the second gate;
   at least one third via electrically engaged to the first semiconducting die and the first conductor pad;
   at least one fourth via electrically engaged to the second semiconducting die and the first conductor pad;
   a second conductor pad located on the first surface;
   a third conductor pad located on the first surface and spaced from the first conductor pad;
   at least one fifth via electrically engaged to the first semiconducting die and the second conductor pad; and
   at least one sixth via electrically engaged to the second semiconducting die and the third conductor pad, wherein the first conductor pad is a phase conductor pad, the second conductor pad is a DC plus pad, and the third conductor pad is a DC minus pad.

2. The embedded power module set forth in claim 1 further comprising:
   a capacitor electrically connected between the second and third conductor pads.

3. The embedded power module set forth in claim 1, wherein the at least one third via is two vias, the at least one fourth via is three vias, the at least one fifth via is three vias, and the at least one sixth via is two vias.

* * * * *